United States Patent [19]

Caruso et al.

[11] Patent Number: 5,592,167
[45] Date of Patent: Jan. 7, 1997

[54] ANALOG-DIGITAL CONVERTER USING CURRENT CONTROLLED VOLTAGE REFERENCE

[75] Inventors: John M. Caruso, Fremont; Quoi V. Huynh, San Jose; Roger A. Levinson, San Francisco, all of Calif.

[73] Assignee: Exar Corporation, San Jose, Calif.

[21] Appl. No.: 325,716

[22] Filed: Oct. 19, 1994

[51] Int. Cl.[6] .................................................. H03M 1/36
[52] U.S. Cl. .................................... 341/159; 341/136
[58] Field of Search ................................. 341/136, 155, 341/159

[56] References Cited

U.S. PATENT DOCUMENTS

| | | | |
|---|---|---|---|
| Re. 34,295 | 6/1993 | Shibuya et al. | 341/133 |
| 4,250,493 | 2/1981 | Kihara et al. | 341/166 |
| 4,549,165 | 10/1985 | Brian | 341/118 |
| 5,111,205 | 5/1992 | Morlon | 341/156 |
| 5,283,579 | 2/1994 | Tasdighi et al. | 341/145 |
| 5,294,927 | 3/1994 | Levinson et al. | 341/141 |

*Primary Examiner*—Marc S. Hoff
*Attorney, Agent, or Firm*—Townsend and Townsend and Crew LLP; Henry K. Woodward

[57] ABSTRACT

A current driven span voltage source for use in an analog to digital converter includes a zero reference resistor serially connected with a resistor ladder. A first current source selectively passes a part of a first current through the resistor ladder to establish a span (gain) voltage range, and a second current source selectively passes a part of a second current through the zero reference resistor to establish a zero reference voltage for the span voltage range. The controlled current sources increase speed, reduce power and thermal noise, and improve temperature related performance as compared with voltage driven span and reference sources using operational amplifiers.

21 Claims, 5 Drawing Sheets

ANALOG-DIGITAL CONVERTER USING CURRENT CONTROLLED VOLTAGE REFERENCE

BACKGROUND OF THE INVENTION

This invention relates generally to analog to digital converters (ADC) and, more particularly, the invention relates to reference voltage control in an ADC.

As illustrated in FIG. 1, an ADC 10 converts an analog signal 12 to digital form at 14 by comparing the analog data to reference voltages to drive a code converter and mapping it to a representative code. The reference voltages are established by a gain digital-analog converter (DAC) 16 and an offset DAC 18. When the data comes from different measurements in a physical system, the reference voltages must be precalibrated for each datum source so that the reference voltage span correlates to the span of the datum source and a zero offset correlates to a zero value of the datum source. For example, in a charge coupled device (CCD) each pixel of an image requires a full scale and a black level correction to compensate for differences in gain and zero (black level) of CCD outputs. By precalculating the detectors in the physical system, digital codes can be used to set a zero reference voltage level and a voltage span for individual measurements.

Heretofore, conventional voltage DACs using fixed voltage references have been employed to obtain the full scale and zero reference voltages, as shown schematically in FIG. 2. The precalculated (or calibrated) digital codes of the control data drive the span (gain) DAC 20 and the zero (scale) DAC 22 which drive voltage followers 24, 26 to establish the reference voltage across the ladder resistor 28. The operational amplifiers of the voltage followers are costly in integrated circuit surface area, increase power consumption, and limit the achievable settling time of the reference. Further, independent control of the zero and full scale reference is desired, but the traditional voltage mode implementation results in interaction between the references whereby a change in the zero reference point also affects the total span. Further, the operational amplifier sees a load impedance in the range of hundreds or a few thousand ohms which results in a wide range of output current which leads to large power supply transients, as well as requiring an idle current to keep the circuit ready for higher speed operation. Further, the operational amplifier can require both plus and minus voltage supplies.

SUMMARY OF THE INVENTION

Briefly, in accordance with the invention, a current interface is used to independently control the span and zero reference voltages in an ADC. Current sources are selectively controlled such as by precalibrated values whereby current passing through the ADC ladder resistor establishes a span (gain) voltage range, and a current passing through a zero reference resistor serially connected with the ladder resistor controls the zero reference voltage for the ladder resistor.

By using current sources in establishing the reference voltage and span voltage, power consumption, power supply transients, settling time, instability, and other problems associated with voltage driven operational amplifiers are eliminated. Importantly, the zero reference voltage is independent of the span voltage adjustment, and constant power consumption is maintained by switching between two current paths internally to change the independent ratios but not the total sum current. This results in less noise generated when the DAC codes changes.

The current driven span and zero reference voltages provide faster settling time due to the elimination of the operational amplifiers and their related settling characteristics.

The invention and objects and features thereof will be more readily apparent from the following detailed description and appended claims when taken with the drawings.

DETAILED DESCRIPTION OF ILLUSTRATIVE EMBODIMENTS

Figure 1:
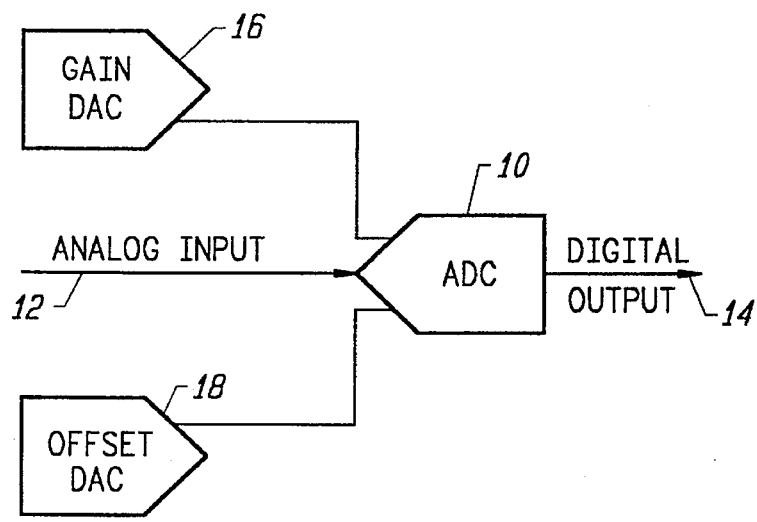
FIG. 1 is a functional block diagram of a conventional ADC employing a gain DAC and an offset DAC.
Figure 2:
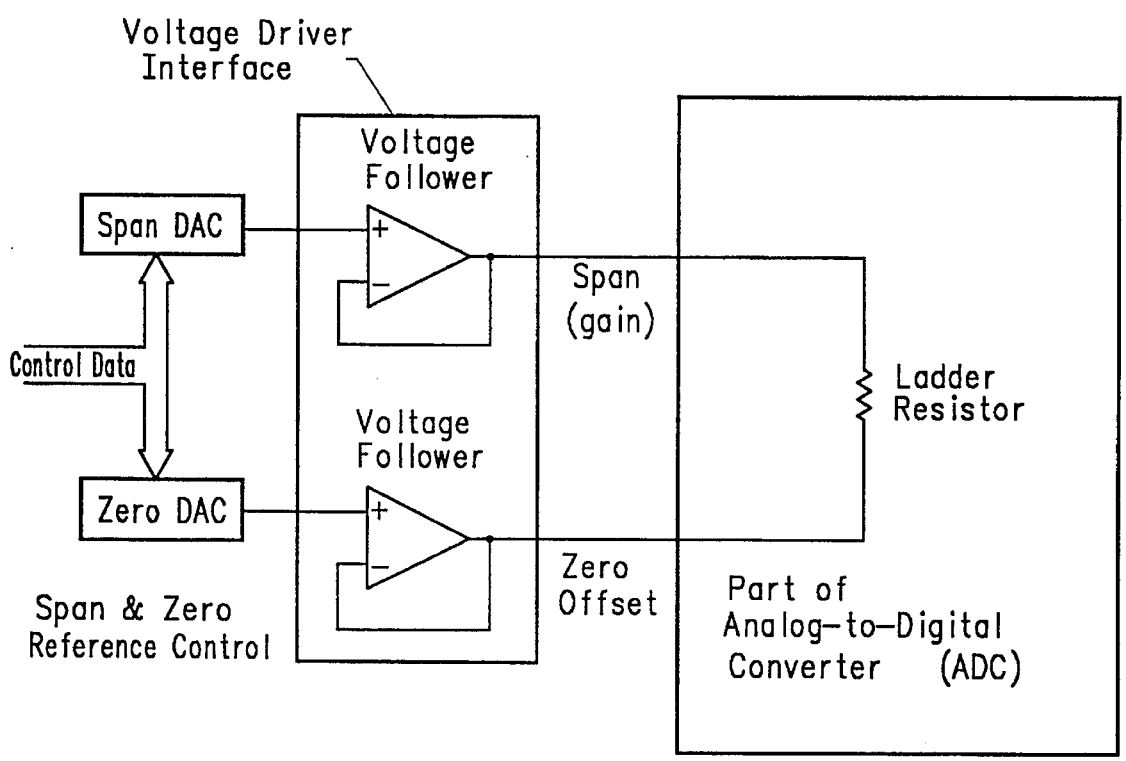
FIG. 2 is a schematic of a voltage controlled DAC in accordance with prior art.
Figure 3:
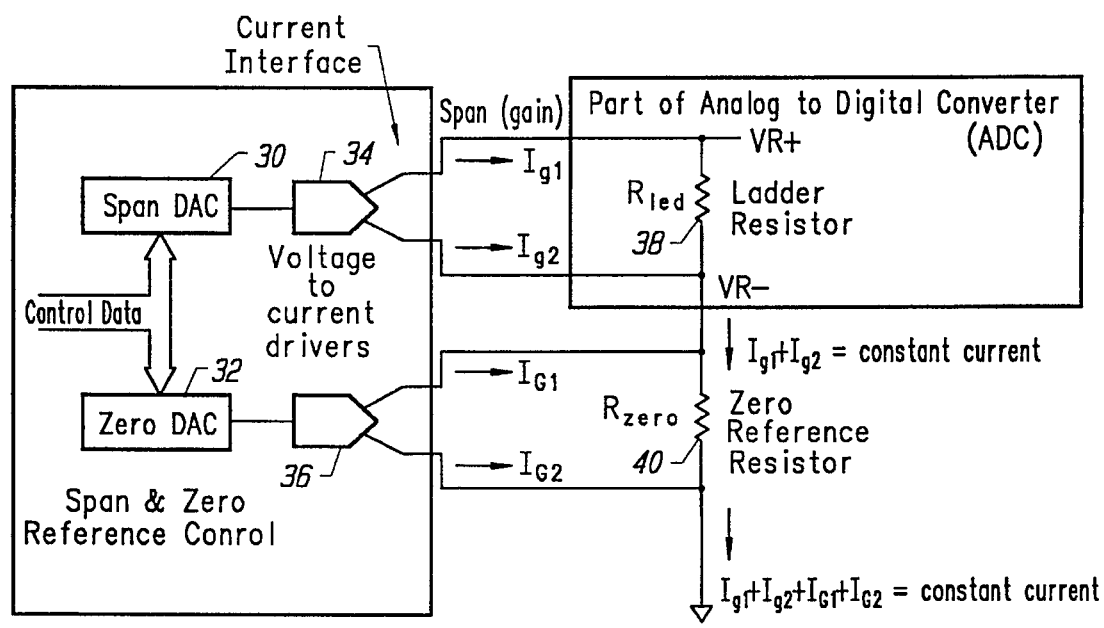
FIG. 3 is a schematic of a current controlled DAC in accordance with the invention.

Referring now to FIG. 3, a current controlled interface in accordance with the invention is illustrated. Again, controlled data is applied to a span DAC 30 and a zero DAC 32 for calibrating the span and zero reference voltages. However, in accordance with the invention the control DACs steer the current flowing in drivers 34, 36 which establish a span voltage and reference voltage across the resistor ladder 38 and the zero reference resistor 40, respectively. More particularly, current driver 34 steers or controls the current $I_{g1}$ which passes through the ladder resistor 38 and current $I_{g2}$ which bypasses the ladder resistor. The total current from the current driver 34 remains constant while the values of $I_{g1}$ and $I_{g2}$ will vary depending on span calibration. The constant current from current driver 34 passes through the zero reference resistor 40 along with a current $I_{O1}$ which is steered from current driver 36 through the zero reference resistor 40 while a current $I_{O2}$ bypasses the zero reference resistor. The reference voltages, VR− and VR+, can be expressed as follows:

$$VR- = (I_{g1} + I_{g2} + I_{o1})R_{ZERO}$$

$$VR+ = VR- + (I_{g1})R_{ladder}$$

Figure 4:
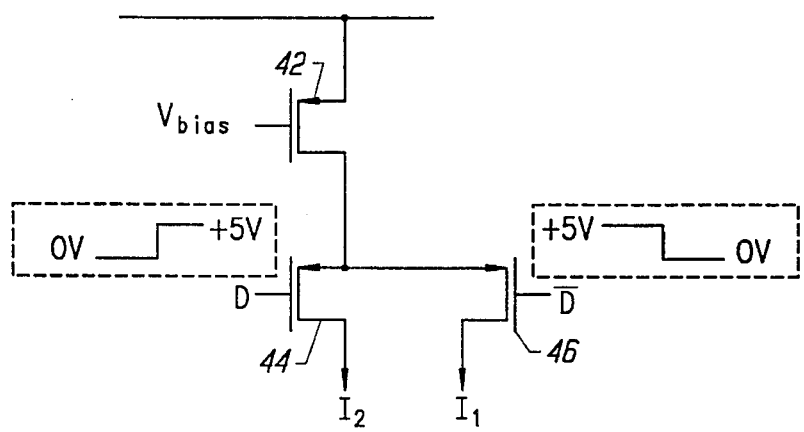
FIG. 4 is a schematic of a current controller in the circuit of FIG. 3.

A preferred construction of a DAC includes a pair of current sources with the output currents steered through controlled complementary data inputs. FIG. 4 is a schematic of illustrative current control transistors where a series $V_{BIAS}$ transistor 42 provides a constant current source to the complementary pairs of transistors 44, 46 which carry currents I1 and I2. The true and complementary inputs (D, $\overline{D}$) switch the constant current through either the transistor 44 or 46 so that at any one time the two transistor legs always add up to the same value of original source current, regardless of which leg is in the "ON" or "OFF" state (includes possibility of both conducting).

Figure 5A:
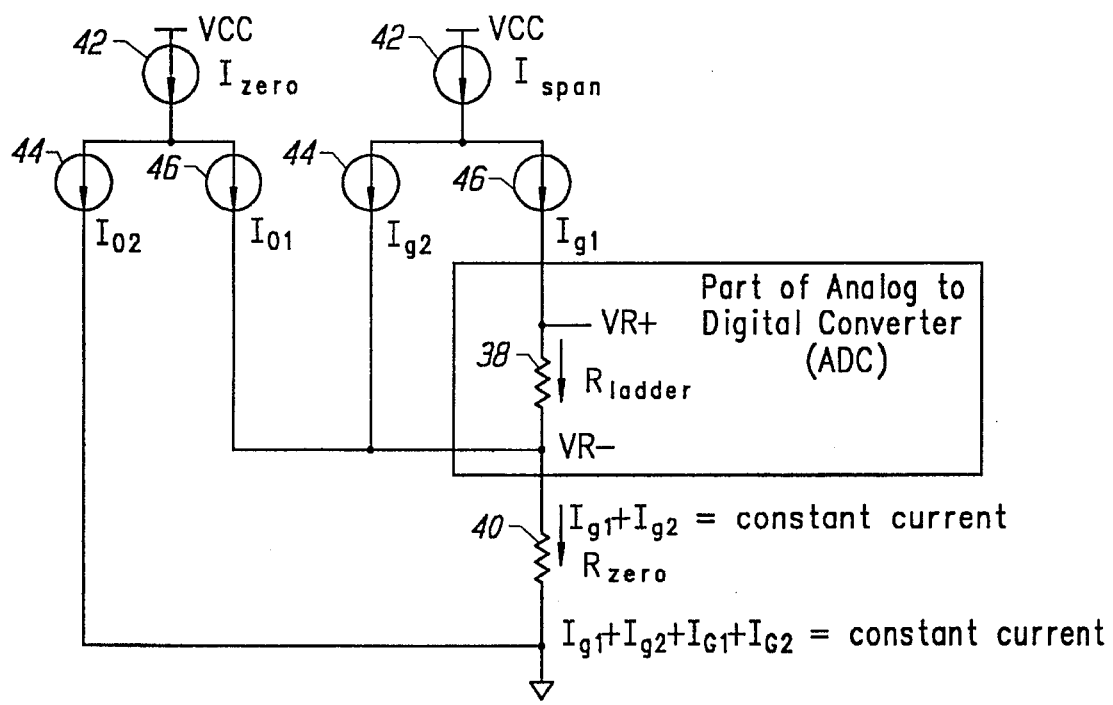
FIGS. 5A, 5B are schematics of the circuit of FIG. 3 using the current controller of FIG. 4.
Figure 5B:
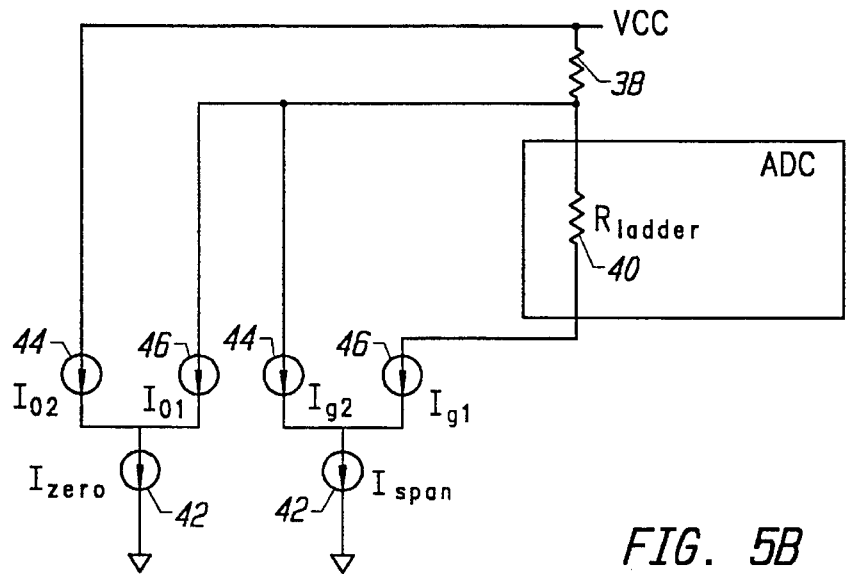

FIGS. 5A and 5B are schematics of the current controlled DAC of FIG. 3 with the current sources of FIG. 4 substituted therein. Like elements in the several drawings have the same reference numerals with reference numerals for the span control transistors having prime numbers. As noted, $I_{g1}+I_{g2}$ is a constant current value, and $I_{O1}+I_{O2}$ is a constant current value. The $I_{g1}$ and $I_{g2}$ currents are variable ratios representative of the original I span current. The amount of current actually passed through the ladder resistor 38 leg controls the ADC span voltage while node VR− at the bottom of the resistor ladder 38 contains the recombined sum of the original current (I span). The ADC span control is achieved without affecting the original current and without affecting the voltage at the bottom of the ladder, node VR−. The ADC zero reference is obtained in a similar fashion starting where VR− equals $(I_{g1}+I_{g2}+I_{O1})\times R_{ZERO}=(Constant+I_{O1})\times R_{ZERO}$. Since the I span current $(I_{g1}+I_{g2})$ is constant, it will also produce a constant the same voltage drop across the zero reference resistor 40 and thereby makes the zero reference voltage independent of changes in the span voltage.

The circuit of FIG. 5A is implemented with the reference span and zero relative to ground. However, the concept can be implemented with the references relative to VCC as shown in FIG. 5B. In this embodiment, the resistors are connected directly to VCC and the current switching transistors are connected to circuit ground.

Figure 6:
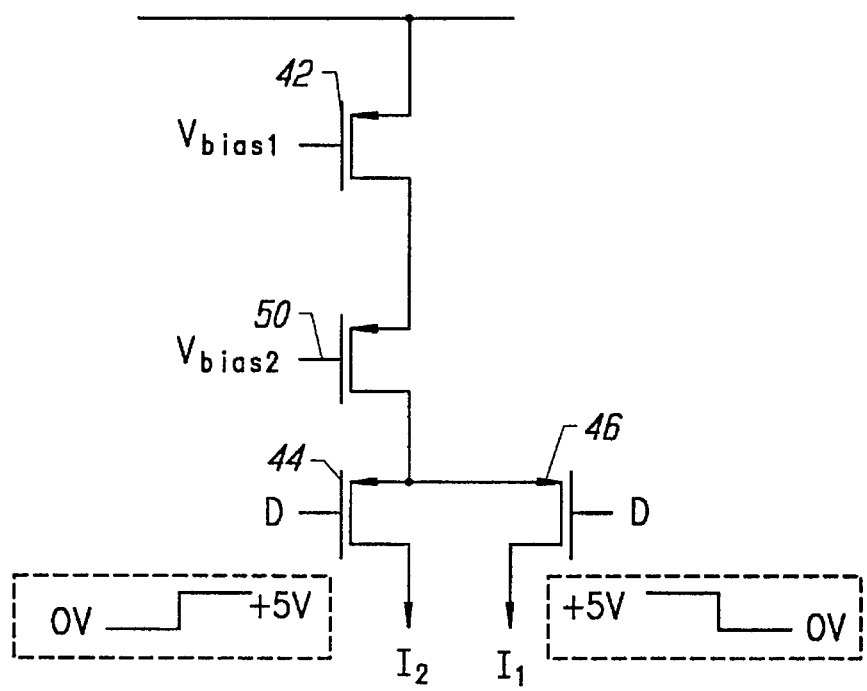
FIG. 6 is a schematic of a current controller using cascode transistor current source circuitry.
Figure 7:
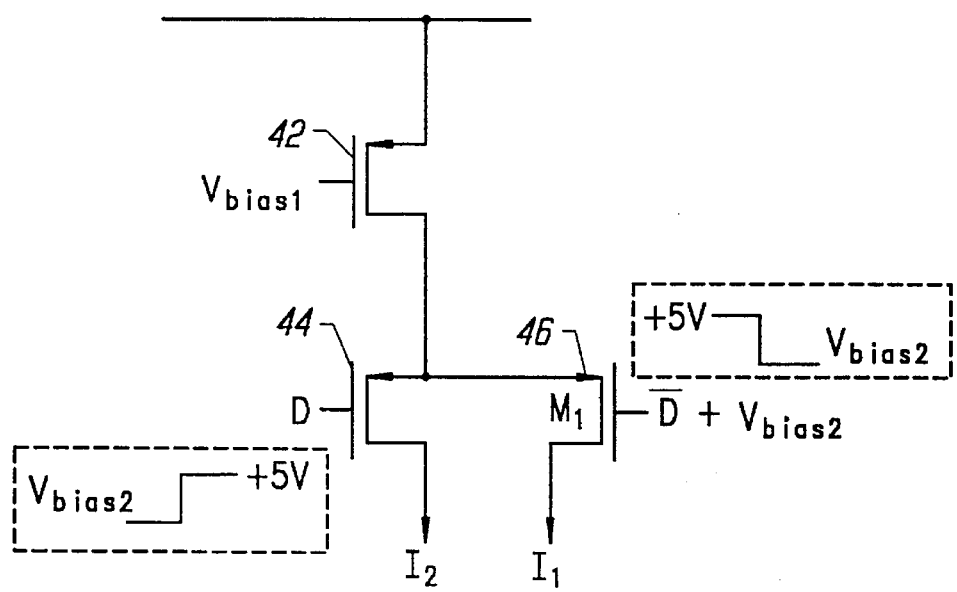
FIG. 7 is a schematic of an alternative cascode current controlled circuit.

The requirement that $I_{g1}+I_{g2}$=Constant and $I_{O1}+I_{O2}$=Constant leads to a design constraint requiring the current source to have a high output impedance or be independent of output voltage. High current source output impedance be less than ideal or infinite impedance, high output impedance can be accomplished by using a cascodeable arrangement as shown in FIGS. 6 and 7. In FIG. 6 the circuit of FIG. 4 is modified by adding an additional series element 50 connected to a specified bias voltage, $V_{BIAS2}$. This added element increases the impedance of the constant current source by providing isolation of the current source from the output voltage changes. FIG. 7 shows an alternative cascodeable arrangement in which the $V_{BIAS2}$ arrangement is applied as a minimum voltage to the inputs D and $\overline{D}$. Accordingly, the control input signals are modified to swing from VCC to a bias voltage rather than from VCC to ground potential. For example, when $\overline{D}$ is connected to $V_{BIAS2}$ transistor 46 will behave like the cascoded transistor 50 in FIG. 6 and provide a high output impedance at the output $I_1$.

Figure 8:
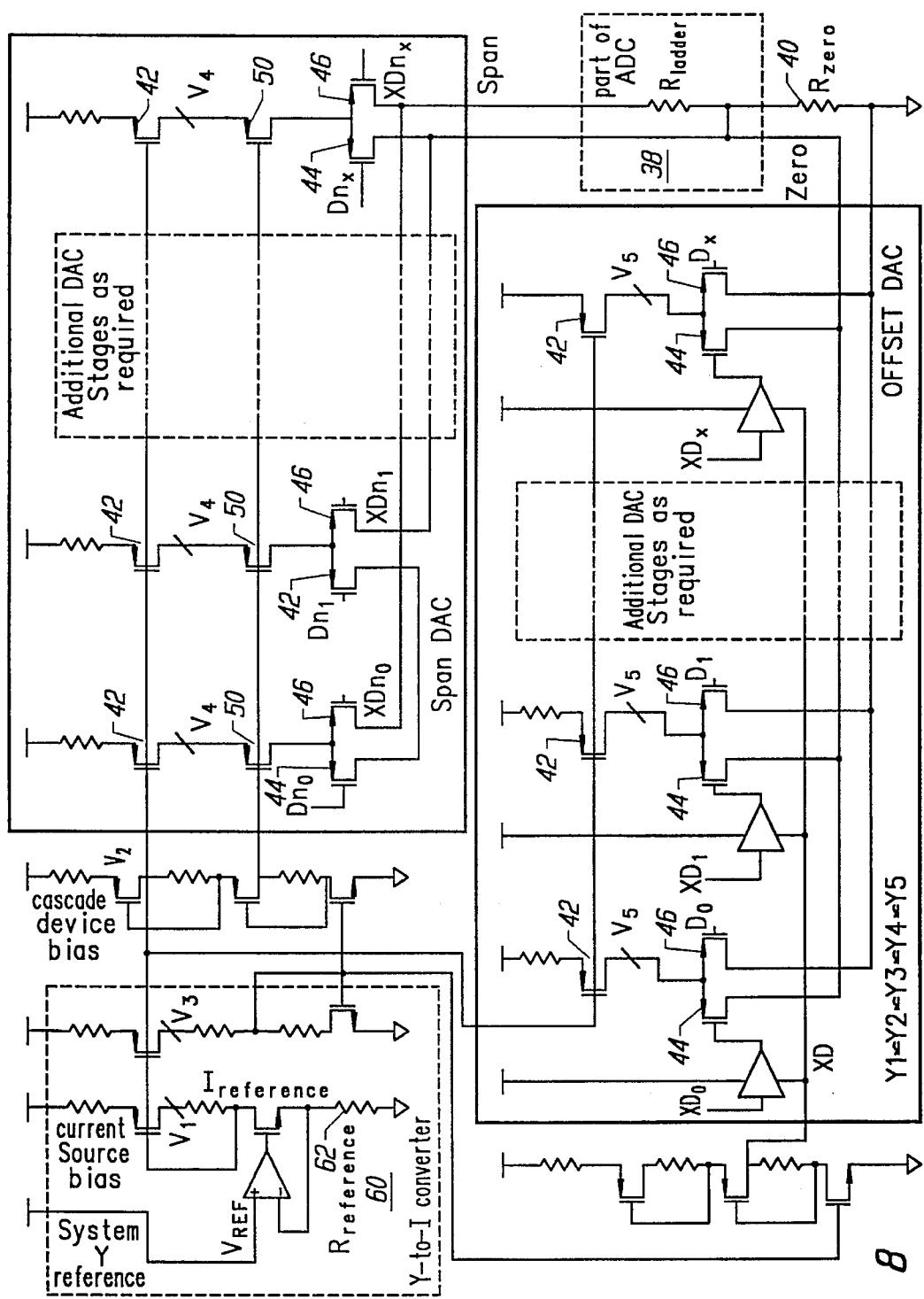
FIG. 8 is a schematic of one commercial implementation of an ADC employing current controlled DACs in accordance with the invention.

FIG. 8 is a schematic of a commercial implementation of the invention designated the MP8830 and manufactured by EXAR Corporation, assignee. A voltage to current converter 60 provides a current reference (I reference) derived from the system reference voltage. The current reference provides accurate calibration of the two digital to analog converters (DACs), one for the span (gain) and one for the zero, that provides the reference to the analog to digital converter (ADC). Each of the DACs has its own bias sources that are connected to the master current reference for control. The span DAC uses two series bias circuits as described above with reference to FIG. 4 while the offset DAC uses the level shift control as described above with reference to FIG. 7. For each leg of the DAC (complementary pair) current is either switched through the associated ladder resistor or through a path that bypasses the associated resistor. The switching signals ($D_x$, $XD_x$) come from a digital control word that is said to contain the data value specific to a particular system function. This can be represented by the case of the CCD digitizer as described above. The span DAC contains the full scale (span) pixel correction value while the offset contains the black level pixel correction value.

A voltage to current converter 60 includes a reference resistor 62 through which a reference current flows for tracking current through the ladder resistor 38 and zero reference resistor 40 in an integrated circuit. Both the span DAC and the offset DAC include a plurality of stages, each driven by a bit and bit bar in the digital calibration code so that the current through the resistor ladder 38 can be the sum of one or more of the individual currents through each DAC stage. Similarly, the current through the zero reference resistor 40 includes not only the current through the ladder resistor 38 but one or more currents passing through the stages of the offset DAC. The integrated circuitry is designed so that the voltages V1 through V5 at various nodes are approximately equal.

Since the reference resistor is made of the same material and integrated along with the ladder resistor and zero reference resistor of the ADC, device matching is insured in the manufacture of the circuitry. While manufacturing tolerances between separate devices can easily be as high as 20%, in a manufacturing process using the same material for all related resistors, as in an integrated circuit, each resistor tends to have the same resultant percentage shift in value whereby the difference between various resistors in the integrated circuitry can be less than 1%. The result in integrating all resistors in a single integrated circuit is an improvement of electrical stability and a reduction in calibration requirements for obtaining high accuracy.

There has been described an ADC which uses current driven DACs to establish a span voltage and a zero reference voltage for use in the ADC. The invention eliminates the use of voltage source references and operational amplifiers as used in driving the traditional ADC. The invention provides a simpler approach in which the interaction between the span and zero reference is eliminated thus resulting in superior overall performance of the digitizing system.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. An analog to digital converter (ADC) for receiving and converting an analog signal to a digital output comprising a code converter, a resistor ladder connected between a zero reference voltage and a maximum span voltage for use in comparing an analog voltage and driving said code converter, a first current driver means for selectively steering part of a first current through said resistor ladder and establishing said span voltage, a zero reference resistor serially connected with said resistor ladder, and a second current driver means for selectively steering a part of a second current through said zero reference resistor for establishing a zero reference voltage for said span voltage.

2. The ADC as defined by claim 1 wherein said first current driver means responds to a span digital code in steering a part of said first current through said resistor ladder and said second current driver means responds to a zero reference digital code in steering a part of said second current through said zero reference resistor.

3. The ADC as defined by claim 2 wherein said first current driver means includes a first plurality of current sources each selectively connected through a first current path through said resistor ladder and through a second current path bypassing said resistor ladder.

4. The ADC as defined by claim 3 wherein said first current path and said second current path are connected through said zero reference resistor.

5. The ADC as defined by claim 3 wherein each current source comprises a first voltage biased transistor.

6. The ADC as defined by claim 5 wherein each current source further includes a second voltage bias transistor serially connected with said first voltage bias transistor in a cascode arrangement.

7. The ADC as defined by claim 6 wherein said second current driver means includes a second plurality of current sources each selectively connected through a first current path through said zero reference resistor and through a second current path bypassing said zero reference resistor.

8. The ADC as defined by claim 7 wherein each current source in said second plurality comprises a voltage biased transistor.

9. The ADC as defined by claim 8 wherein each of said first current path and said second current path of each of said second plurality of current sources comprises a field effect transistor and means for selectively biasing said field effect transistor with one of two bias voltages.

10. The ADC as defined by claim 9 wherein said ADC comprises an integrated circuit.

11. The ADC as defined by claim 2 wherein said ADC comprises an integrated circuit.

12. For use in an analog to digital converter (ADC), a current driven span voltage generator comprising a resistor ladder connected between a zero reference voltage and a maximum span voltage, a first current driver means for selectively steering part of a first current through said resistor ladder and establishing said span voltage, a zero reference resistor serially connected with said resistor ladder, and a second current driver means for selectively steering part of a second current through said zero reference resistor for establishing a zero reference voltage for said span voltage.

13. The current driven span voltage generator as defined by claim 12 wherein said first current driver means responds to a span calibration digital code in steering part of said first current through said resistor ladder, and said second current driver means responds to a zero reference calibration digital code in steering part of said second current through said zero reference resistor.

14. The current driven span voltage generator as defined by claim 13 wherein said first current driver means includes a first plurality of current sources each selectively connected through a first current path through said resistor ladder and through a second current path bypassing said resistor ladder.

15. The current driven span voltage generator as defined by claim 14 wherein said first current path and said second current path are connected through said zero reference resistor.

16. The current driven span voltage generator as defined by claim 15 wherein each current source comprises a first voltage biased transistor.

17. The current driven span voltage generator as defined by claim 16 wherein each current source includes a second voltage bias transistor serially connected with said first voltage bias transistor in a cascodeable arrangement.

18. A current driven span voltage generator as defined by claim 17 wherein said second current driver means includes a second plurality of current sources each selectively connected through a first current path through said zero reference resistor and through a second current path bypassing said zero reference resistor.

19. The current driven span voltage generator as defined by claim 17 wherein each current source in said second plurality comprises a voltage bias transistor.

20. The current drive span voltage generator as defined by claim 19 wherein each of said first current path and said second current path of each of said second plurality of current sources comprises a field effect transistor and a means for selectively biasing said field effect transistor with one of two bias voltages.

21. The current driven span voltage generator as defined by claim 20 wherein said generator comprises an integrated circuit.

* * * * *